United States Patent

[11] 3,626,252

[72] Inventor Pieter G. Cath
Aurora, Ohio
[21] Appl. No. 4,475
[22] Filed Jan. 21, 1970
[45] Patented Dec. 7, 1971
[73] Assignee Keithley Instruments, Inc.
Solon, Ohio

[54] TEMPERATURE EQUALIZATION FOR PRINTED CIRCUITS
16 Claims, 1 Drawing Fig.

[52] U.S. Cl. .......... 317/100, 317/234 A, 29/627
[51] Int. Cl. .......... H05k 1/02, H05k 7/20
[50] Field of Search .......... 317/100, 101 C, 234 (1); 29/624–627

[56] References Cited
UNITED STATES PATENTS
3,257,621 6/1966 Jadovl .......... 317/234
3,411,049 11/1968 Trincossi .......... 317/100 X
3,428,871 2/1969 Scott .......... 317/234

*Primary Examiner*—Lewis H. Myers
*Assistant Examiner*—Gerald P. Tolin
*Attorney*—Yount and Tarolli

ABSTRACT: Leads of various electronic devices which are mounted on a printed circuit board each form a junction with the conductive pattern on the printed circuit at a different location, and temperature variations at these junctions may cause undesirable effects in the electrical circuit in which the devices are employed. Thermally-produced effects that result when the junctions of a printed circuit are at different temperatures are substantially eliminated by a thermally-conductive, electrically-insulating substance, such as silicone grease, which contacts the leads and the conductive pattern. The thermally-conductive silicone grease is contained in a grease container formed of a rubber "0" ring and an aluminum disk. The rubber "0" ring encircles the grease and is pressed against one side of a printed circuit board, which contains a conductive pattern, by the aluminum disk which is secured to the board.

PATENTED DEC 7 1971 3,626,252
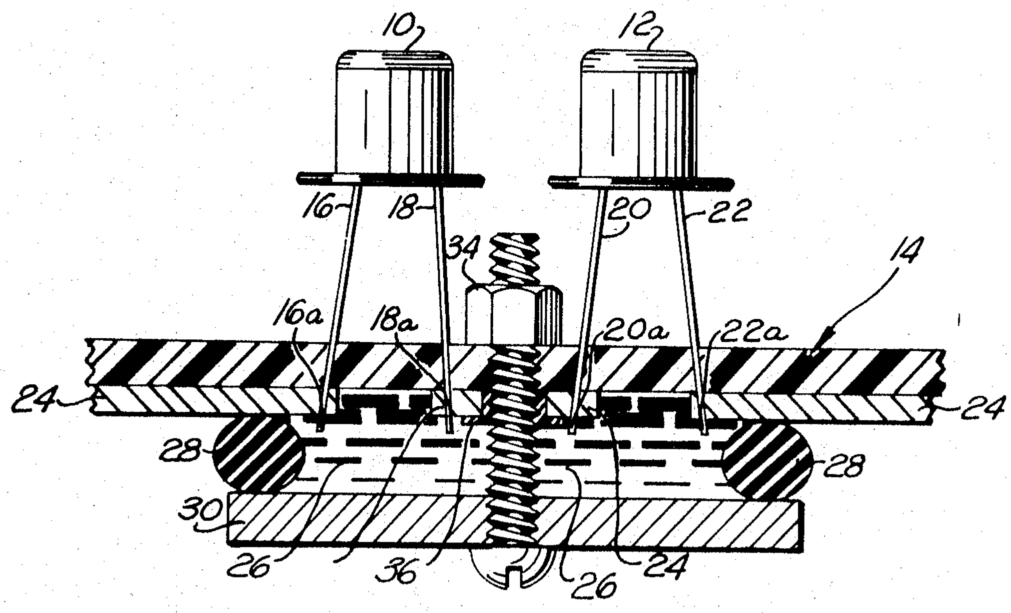
INVENTOR
PIETER G. CATH
BY Yount and Tarolli
ATTORNEYS

TEMPERATURE EQUALIZATION FOR PRINTED CIRCUITS

The present invention relates to the elimination of thermally-produced effects in printed circuits.

Sensitive measuring instruments, such as microvoltmeters and microammeters, and other electric circuits, commonly employ printed circuit boards on which are mounted electronic devices, such as semiconductor transistors. Localized heating of the printed circuit board may seriously reduce the accuracy of the measuring instrument due to the thermally-produced effects which are caused by unequal temperatures at critical junctions of the leads of the electronic devices and the conductive pattern of the printed circuit. In the disclosed invention, a thermally-conductive silicone grease is employed to equalize the temperature of selected junctions of the conductive pattern and the device leads. The disclosed invention is especially useful for equalizing junction temperatures at critical junctions of the printed circuit which involve a number of semiconductor elements that are employed in a common circuit.

It is an object of the present invention to provide temperature equalization at selected junctions of a plurality of leads of electronic devices and the conductive pattern of a printed circuit to eliminate the resulting thermally-produced effects, especially thermoelectric effects, the desired temperature equalization being achieved by a thermally-conductive substance, preferably silicon grease.

It is an additional object of the present invention to equalize the temperature at selected junctions of a plurality of leads of electronic devices in a common circuit by contacting the junctions with a thermally-conductive, electrically-insulating substance, preferably a silicone grease, which extends between the junctions, the thermally-conductive substance being preferably contained in a container consisting of a heat-conductive metal member, such as an aluminum disk, and an electrically-insulating member, such as a rubber "0" ring, which is pressed against a side of the printed circuit board containing the conductive pattern by the aluminum disk.

Other objects and advantages of the disclosed invention will be apparent from the description in conjunction with the drawing in which:

The FIG. is a side view, partially sectionalized, showing a printed circuit board, a pair of transistors in a common circuit, and a thermally-conducting grease container.

Printed circuit are commonly employed in sensitive measuring instruments, such as microvoltmeters and microammeters, and in other electrical apparatus, in which semiconductor devices with Kovar leads, (an iron alloy) or other types of leads, are soldered to a conductive pattern of copper, or other metal, to form the various circuits of the measuring instrument. If a printed circuit board is not at a uniform temperature over its entire surface, then errors will result in the measuring instrument due to thermally-produced effects.

One particularly undesirable thermally-produced effect results from the interaction of the leads and the conductive pattern when the two metals or alloys which are joined at a junction form a thermoelectric junction, i.e. a thermo-couple. Thermally-produced effects, including thermoelectric effects, are especially undesirable in sensitive measuring instruments, and in other electrical circuits, that include semiconductor stages in which two or more adjacent semiconductors substantially interact with one another in operation, as for example in chopper circuits or in push-pull amplifier circuits.

A temperature difference between two dissimilar metals or alloys forming a junction, such as Kovar and copper, will produce an undesired signal due to the Seeback effect. Other thermally-produced signals may occur in a transistor or other semiconductor device that has leads at different temperatures due to thermally-induced activity of the charge carriers of the transistor or semiconductor device. THe disclosed invention minimizes the resulting undesired signals which may be produced by the above-mentioned thermally-produced effects in a printed circuit.

Referring to the drawing a circuit comprises transistors 10 and 12 are mounted on a printed circuit board 14. The transistors 10 and 12 have leads 16 and 18, and 20 and 22 respectively which are connected at their respective junctions 16*a*, 18*a*, 20*a*, and 22*a* to a conductive pattern 24 of the printed circuit board to connect the transistors into a common circuit, such as a measuring circuit, a chopper circuit or a push-pull amplifier circuit. If, during operation, the left-hand portion of the printed circuit board 14 were to become warmer than the right-hand side of the printed circuit board 14, unequal thermo-electric effects would result at the junctions of the leads 16, 18, 20 and 22 and the conductive pattern 24 of the printed circuit board 14 and errors may be introduced into the circuit employing the transistors 10 and 12.

Temperature equalization may be accomplished in accordance with the disclosed embodiment by contacting and connecting the leads 16, 18, 20 and 22 at the junctions 16*a*, 18*a*, 20*a* and 22*a* where they join the conductive pattern 24 with a substance which has a high thermal conductivity and is electrically-insulating. Although a single-sided circuit board is presently preferred, temperature equalization may also be provided between the junctions of different sides of a printed circuit board or between the junctions of a multilayer circuit board within the scope of the present invention.

The substance that is presently preferred as the thermally-conductive substance is commercially available thermally-conductive silicon grease 26. One suitable silicone grease is type 340 heat sink compound made by Dow Corning which contains numerous metal-oxide particles. This silicone grease 26 intimately contacts the junctions of the semiconductor leads 16, 18, 20 and 22 and the conductive pattern 24 so that it follows irregular surfaces and fills air spaces, thereby providing a uniform thermally-conducting contact which thermally connects the selected junctions to provide temperature equalization of these junctions.

In the disclosed embodiment the grease is confined by a container comprising a rubber "0" ring 28, which encircles the thermally-conductive silicone grease 26, and an aluminum disk 30, which is in contact with the thermally-conductive silicone grease 26 and with the rubber "0" ring 28. The aluminum disk 30, which assists in equalizing the temperature of the portion of the printed circuit board 14 that is encircled by the rubber "0" ring 28, is secured to the printed circuit board 14 by a bolt 32 and a nut 34, or by other equivalent means, such as a screw or rivet. The bolt 32 is electrically insulated from the conductive pattern 24 of the printed circuit board 14 by a rubber insulating ring 36.

During operation the grease which fills the container and covers the side of the printed circuit board where the junctions 16*a*,18*a* 20*a* and 22*a* readily conducts heat between the junctions to maintain the junctions at substantially the same temperature. This prevents hot and cold thermocouple junctions from being set up and the thermoelectric currents associated therewith which adversely affect the operation of the circuit.

While the invention has been described with reference to the employment of two transistors in a common circuit, it is to be understood that the invention is also applicable to a number of electronic devices, including a single device, and it is also applicable to integrated circuit elements when they are employed in conjunction with a printed circuit.

What is claimed is:

1. An electrical apparatus comprising electronic circuit means having a plurality of electrical leads and a printed circuit conductive pattern, said leads being joined to the conductive pattern at junctions, a substantially thermally-conductive, electrically-insulating substance contacting said conductive pattern and said leads at selected junctions thereof and extending between said selected junctions to thermally connect said junctions and to substantially equalize the temperature of the junctions.

2. An electrical apparatus as defined in claim 1 wherein the thermally-conductive substance is a silicone grease.

3. An electrical apparatus as defined in claim 1 wherein a thermally-conductive metal member is disposed adjacent to the conductive pattern of the printed circuit and an electrically-insulating member is disposed between the metal member and the conductive pattern to form with the metal member a container for said substance, said said substance filling said container, and means for securing said container to said conductive pattern.

4. An electrical apparatus as defined in claim 1 wherein said electronic circuit means comprises a plurality of semiconductor devices connected into a common circuit and each having leads forming junctions with said conductive pattern, said substance extending between and thermally connecting said junctions of the leads of said devices.

5. An electrical apparatus as defined in claim 3 wherein the thermally-conductive substance is a silicone grease.

6. An electrical apparatus as defined in claim 4 wherein the thermally-conductive substance is a silicone grease.

7. An electrical apparatus as defined in claim 4 wherein a thermally-conductive metal member is disposed adjacent to the conductive pattern of the printed circuit and an electrically-insulating member is disposed between the metal member and the conductive pattern to form with the metal member a container for said substance, said substance filling said container, and means for securing said container to said conductive pattern.

8. An electrical apparatus as defined in claim 3 wherein the thermally-conductive substance is a silicone grease.

9. An electrical apparatus comprising electronic circuit means having a plurality of leads and a printed circuit conductive pattern, said leads and the printed circuit conductive pattern being formed of a different metals and said leads being joined to the conductive pattern at junctions, said different metals constituting thermoelectric junctions where they contact one another, a substantially thermally-conductive, electrically-insulating substance contacting said conductive pattern and said leads at said junctions and extending between said selected junctions to thermally connect said junctions and substantially equalize the temperatures thereof.

10. An electrical apparatus as defined in claim 9 wherein the thermally-conductive substance is a silicone grease.

11. An electrical apparatus as defined in claim 9 wherein a thermally-conductive metal member is disposed adjacent to the conductive pattern of the printed circuit and an electrically-insulating member is disposed between the metal member and the conductive pattern to form with the metal member a container for said substance, said substance filling said container, and means for securing said container to said conductive pattern.

12. An electrical apparatus as defined in claim 9 wherein said electronic circuit means comprises a plurality of semiconductor devices connected into a common circuit and each having leads forming junctions with said conductive pattern, said substance extending between and thermally connecting said junctions of the leads of said devices.

13. An electrical apparatus as defined in claim 12 wherein the thermally-conductive substance is a silicone grease.

14. An electrical apparatus as defined in claim 12 wherein a thermally-conductive metal member is disposed adjacent to the conductive pattern of the printed circuit and an electrically-insulating member is disposed between the metal member and the conductive pattern to form with the metal member a container for said substance, said substance filling said container, and means for securing said container to said conductive pattern.

15. An electrical apparatus as defined in claim 14 wherein the thermally-conductive substance is a silicone grease.

16. A method of eliminating thermally-produced effects in printed circuits which are caused by temperature differences between junctions of the printed circuit, the junctions being formed at the connection points of the leads of electronic devices that are utilized in the circuit and the conductive pattern of the printed circuit, comprising thermally connecting a plurality of the junctions of the printed circuit by a greaselike thermally-conductive electrically-insulating substance to substantially equalize the temperature therebetween.

* * * * *